US006946868B2

(12) United States Patent
Svensson et al.

(10) Patent No.: US 6,946,868 B2
(45) Date of Patent: Sep. 20, 2005

(54) LINE REFLECTION REDUCTION WITH ENERGY-RECOVERY DRIVER

(75) Inventors: Lars G. Svensson, Gothenburg (SE); William C. Athas, San Jose, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 10/776,927

(22) Filed: Feb. 10, 2004

(65) Prior Publication Data

US 2004/0183566 A1 Sep. 23, 2004

Related U.S. Application Data

(63) Continuation of application No. 10/270,851, filed on Oct. 14, 2002, now Pat. No. 6,696,853, which is a continuation of application No. 09/532,798, filed on Mar. 21, 2000, now Pat. No. 6,486,697.
(60) Provisional application No. 60/125,580, filed on Mar. 22, 1999.

(51) Int. Cl.[7] .............................................. H03K 19/003
(52) U.S. Cl. .............................. 326/30; 326/31; 326/62
(58) Field of Search ............................ 326/30, 59, 62, 326/31, 83, 34, 86, 87

(56) References Cited

U.S. PATENT DOCUMENTS

| 4,038,564 A | | 7/1977 | Hakata | |
|---|---|---|---|---|
| 4,168,498 A | | 9/1979 | Kubota et al. | |
| 4,818,981 A | | 4/1989 | Oki et al. | |
| 5,095,231 A | * | 3/1992 | Sartori et al. | 326/30 |
| 5,247,376 A | | 9/1993 | Wakai | |
| 5,266,894 A | * | 11/1993 | Takagi et al. | 324/765 |
| 5,532,616 A | * | 7/1996 | Keeney | 326/30 |
| 5,631,575 A | | 5/1997 | Lee et al. | |
| 5,760,601 A | * | 6/1998 | Frankeny | 326/30 |
| 5,811,984 A | | 9/1998 | Long et al. | |
| 5,838,289 A | | 11/1998 | Saito et al. | |
| 5,898,326 A | * | 4/1999 | Okayasu | 327/112 |
| 6,140,848 A | | 10/2000 | Harvey | |

FOREIGN PATENT DOCUMENTS

| JP | 56091536 | 7/1981 |
|---|---|---|
| JP | 56153840 | 11/1981 |
| JP | 61003526 | 1/1986 |

OTHER PUBLICATIONS

Sekiguchi, T. et al. "Low–Noise, High–Speed Data Transmission Using a Ringing–Canceling Output Buffer." IEEE Journal of Solid–State Circuits, vol. 30, No. 12, 1995, pp. 1569–1574. Dec. 1995.
"Ground/VH Compensation for CMOS Boundary Scan Off–Chip Drivers," IBM Technical Disclosure Bulletin, vol. 33, No. 6B, Nov. 1990, pp. 205–207.

* cited by examiner

Primary Examiner—John B Nguyen
(74) Attorney, Agent, or Firm—McDermott Will & Emery LLP

(57) ABSTRACT

A system and method for reducing reflections in a transmission line and for recovering energy from the load in the transmission during the process. At least three drive signal levels are utilized. The transition from the second level to the third level during a rising transition and the transition from the second level to the first level during a falling transition is timed to coincide with the arrival of the reflected signal from the immediately-preceding transition. A capacitor is advantageously used as the source for the intermediate drive signal levels and advantageously facilitates energy recovery and conservation.

24 Claims, 5 Drawing Sheets

LINE REFLECTION REDUCTION WITH ENERGY-RECOVERY DRIVER

CROSS-REFERENCE TO RELATED APPLICATION

This application is a continuation of application Ser. No. 10/270,851, filed Oct. 14, 2002 is now a U.S. Pat. No. 6,696,853, entitled "Line Reflection Reduction with Energy-Recovery Driver," which is a continuation of application Ser. No. 09/532,798, filed Mar. 21, 2000 is now a U.S. Pat. No. 6,486,697, entitled "Line Reflection Reduction with Energy-Recovery Driver," the contents of which are incorporated herein by reference.

application Ser. No. 09/532,798 claimed the benefit of U.S. Provisional Application No. 60/125,580, filed Mar. 22, 1999, entitled "Line Reflection Cancellation with Energy-Recovery Driver," the contents of which are incorporated herein by reference.

GOVERNMENT LICENSE RIGHTS

The invention was made with government support under DAAL01-95-K-3528 sponsored by DARPA and MDA904-93-C-L042 sponsored by DOD. The government has certain rights in the invention.

BACKGROUND OF THE INVENTION

1. Field of the Invention

This invention relates to line drivers and, more particularly, to techniques for reducing ringing and power losses in line driving systems.

2. Description of Related Art

Line reflection decreases the noise margin in high-speed digital circuits, especially line reflections induced by signal buffers driving off-chip loads.

The signal buffer acts as a line driver. After the driver causes a signal transition, the transition travels from the source (near) end of the transmission line to the load (far) end. Upon reaching the end, the signal transition is usually reflected at the far end and travels back toward the source. The reflected signal is then usually again reflected upon reaching the source back towards the load. This process continues until the cumulated losses cause the reflection to die out. The resulting voltage waveform seen at either end of the transmission line is typically an exponentially-damped oscillation, often referred to as "ringing."

Ringing often creates problems. It often causes the voltage on the transmission line to exceed allowable or safe levels. Therefore, circuitry connected to the line must be designed to accommodate higher voltage levels than are actually needed. The ringing can also be erroneously interpreted as a change in the state of the data on the line.

In the past, efforts have been made to match the impedance of the driver to the transmission line and/or the impedance of the transmission line to the load. If the impedance at one end or the other is perfectly matched, there would normally be no reflection.

A simple approach used to match the impedance between the transmission line and the load is to connect a resistance at the end of the transmission line to ground. This approach, however, causes additional power to be dissipated in the resistance that is added. This is undesirable in low-power applications, such as in a VLSI pin driver used for fast chip-to-chip communication.

A simple approach for matching the impedance between the driver and the transmission line is to insert a resistance in series between the output of the driver and the input of the transmission line. Again, however, the addition of such a resistance increases power dissipation.

Another problem with line driving systems is the dissipation of power that occurs during transitions of the signal. This is particularly true when the load includes a substantial capacitive reactance, such as in a VLSI pin driver used for fast chip-to-chip communication.

In short, there is a need for a driver that drives a transmission line connected to a load which substantially reduces ringing without wasting power and which, preferably, reduces the energy that is dissipated during operation.

SUMMARY OF INVENTION

One object of the invention is to obviate these as well as other problems in the prior art.

Another object of the invention is to reduce ringing in transmission-line driving systems.

A still further object of the invention is to reduce ringing in transmission-line driving systems without increasing power dissipation.

A still further object of the invention is to reduce the maximum voltage-level specification of circuitry that is connected to a transmission-line driving system.

A still further object of the invention is to reduce data errors caused by transient signals in transmission-line driving systems.

A still further object of the invention is to conserve energy consumed by a transmission line and the load it drives.

These as well as still further objects of the invention are achieved by an apparatus and method that transition the input signal to a transmission line in a plurality of steps and that cause at least one of those steps to coincide with the arrival of a reflected signal back at the input of the transmission line.

In one embodiment of the invention, a signal generation system generates at least a first drive signal, second drive and third drive signal, the second drive signal having a level greater than the first drive signal, and the third drive signal having a level greater than the second drive signal. A controller is in communication with the signal generation system to cause the signal generation system to deliver the first drive signal, then second drive signal, and then third drive signal to the input of the transmission line. The third drive signal begins to be delivered to the input of the transmission line approximately when a reflection of the second drive signal from the output of the transmission line first arrives at the input to the transmission line.

In a still further embodiment of the invention, the controller also causes the signal generation system to deliver the third drive signal, then second drive signal, and then drive first drive signal to the input of the transmission line. During this phase, the first drive signal begins to be delivered to the input of the transmission line at approximately when a reflection of the second drive signal from the output of the transmission line first arrives at the input to the transmission line. In this embodiment, the signal generation system preferably includes a source of the second drive signal that includes an energy storage device, such as a capacitor. In a preferred embodiment, the capacitor receives all of its charge solely from the transmission line.

In a still further embodiment of the invention, the level of the second drive signal is approximately midway between the level of the first drive signal and the third drive signal.

In a still further embodiment of the invention, the level of the second drive signal is approximately equal to the reflected level of the first drive signal and the reflected level of the third drive signal.

In a still further embodiment of the invention, the signal generation system also generates a plurality of drive signals, in addition to the first drive signal, second drive signal and third drive signal. In a preferred embodiment, the source for each of the plurality of additional drive signals includes an energy storage device, such as a capacitor. Preferably, each capacitor receives all of its charge solely from the transmission line.

In a still further embodiment of the invention, the signal generation system includes a supply for generating each of the drive signals and a switching system that selectively connects each of the drive signals to the input of the transmission line. In this embodiment, the controller controls the switching system.

The invention also includes a process for driving a transmission line connected to a load, the transmission line having an input and an output.

In one embodiment of the process, a first drive signal, second drive signal and third drive signal is generated. The second drive signal has a level greater than the first drive signal; and the third drive signal has a level greater than the second drive signal. The first drive signal, second drive signal and then third drive signal is delivered to the input of the transmission line. The delivery of the third drive signal begins approximately when the reflection of the second drive signal from the output of the transmission line first arrives at the input to the transmission line.

In another embodiment of the process, the third drive signal, second drive signal and then first drive signal is also delivered to the input of the transmission line. In this embodiment, the first drive signal begins to be delivered to the input of the transmission line at approximately when a reflection of the second drive signal from the output of the transmission line first arrives at the input of the transmission line.

In a still further embodiment of the process, a source is used to provide the second drive signal and includes an energy storage device, such as a capacitor. Preferably, the capacitor receives all of its charge solely from the transmission line.

In a still further embodiment of the process, the level of the second drive signal is approximately midway between the level of the first drive signal and the third drive signal.

In a still further embodiment of the process, the level of the second drive signal is somewhat above the midway level on the rising transition and somewhat below the midway level on the falling transition.

In a still further embodiment of the process, a plurality of drive signals are generated, in addition to the first drive signal, second drive signal and third drive signal. Preferably, a source is used to generate each of the additional drive signals, each source including an energy storage device, such as a capacitor. Preferably, each capacitor receives all of its charge solely from the transmission line.

In a still further embodiment of the process, a supply generates each of the drive signals and a switching system selectively connects each of the drive signals to the input of the transmission line. In this embodiment, a controller controls the switching system.

In a still further embodiment of the invention, a driver drives a transmission line having an input connected to the driver and an output connected to a capacitive load. The driver includes a high-potential voltage source; a first electronically-controlled switch connected between the high-potential voltage source and the input of the transmission line; a low-potential voltage source; a second electronically-controlled switch connected between the low-potential voltage source and the input of the transmission line; an energy storage device, such as a capacitor; a third electronically-controlled switch connected between the capacitor and the input of the transmission line; and a controller connected to the first, second and third electronically-controlled switches. The controller causes the third electronically-controlled switch to close approximately when a signal injected into the transmission line by the second electronically-controlled switch returns back to input of the transmission line. The controller also causes the first electronically-controlled switch to close approximately when a signal injected into the transmission line by the second electronically-controlled switch returns back to the input of the transmission line.

These as well as still further objects, features and benefits of the invention will now become clear from a review of the following detailed description of the preferred embodiments, read in conjunction with the accompanying drawings.

DETAILED DESCRIPTION OF PREFERRED EMBODIMENTS

Figure 1:
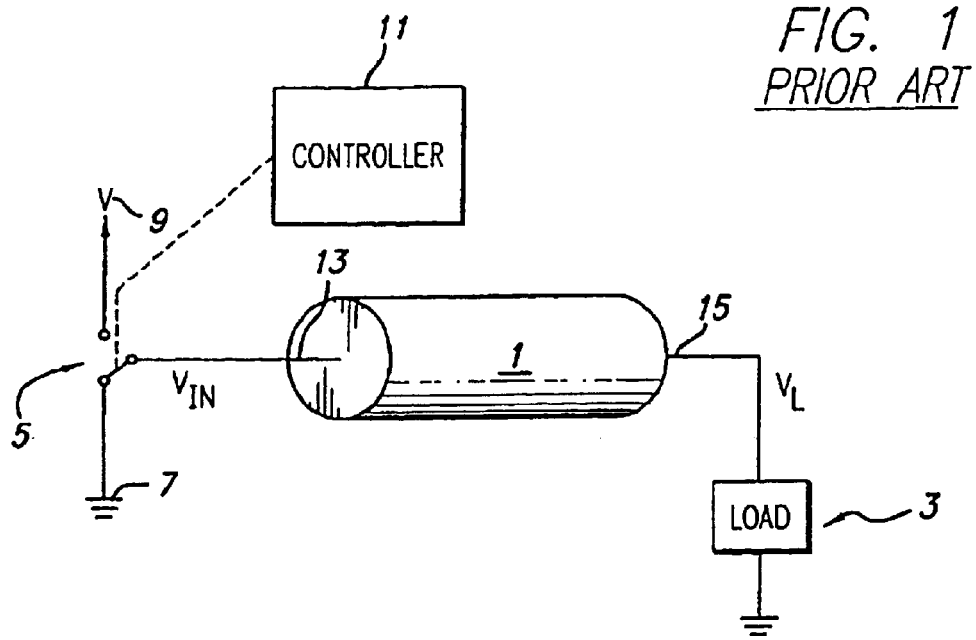
FIG. 1 illustrates a prior art line driver system.

FIG. 1 illustrates a prior art line driver system.

As shown in FIG. 1, a transmission line 1 delivers a voltage $V_L$ to a load 3.

The transmission line 1 is driven by a driver. The driver includes a signal generation system, including a switch 5, a first drive signal 7 (which is shown in this example as being ground) and a second drive signal 9 (which is shown as being a source of voltage V). The signal generation system is connected to a controller 11 which electronically controls the switch 5, thus causing $V_{IN}$ at an input 13 of the transmission line 1 to switch between the first drive signal 7 (ground) and the second drive signal 9 (V). In a typical configuration, the switch 5 is an electronic switch, such as a FET, MOSFET, SCR, triac or BJT.

The goal of the prior art line driver system shown in FIG. 1, of course, is to cause $V_L$ at an output 15 of the transmission line that is across the load 3 to switch between the levels of the first drive signal (ground) and the second drive signal (V) in synchronism with the control signal generated by the controller 11. In a typical system, the controller 11 receives data as a serial stream of logical "ones" and "zeros." The net result is that the data is delivered to the load 3.

In practice, however, the signal that is generated by a transition (rising or falling) in $V_{IN}$ at the input 13 to the transmission line 1 is reflected at the output 15 of the transmission line 1 back to the input 13. This occurs when, for instance, the impedance of the load 3 does not match the impedance of the transmission line 1.

When the reflected signal arrives back at the input 13 to the transmission line 1, it is usually again reflected back to the output 15 of the transmission line 1. This typically occurs because the impedance of the signal generation system is also not the same as the impedance of the transmission line 1.

This now twice-reflected signal is again reflected when it reaches the output 15 of the transmission line 1 back to the input 13. This process repeats until the losses in the system reduce the magnitude of a reflection to zero. Typically, the magnitude of the reflected signal decays exponentially. This phenomena is often referred to as "ringing" because of its oscillatory nature.

Figure 2:
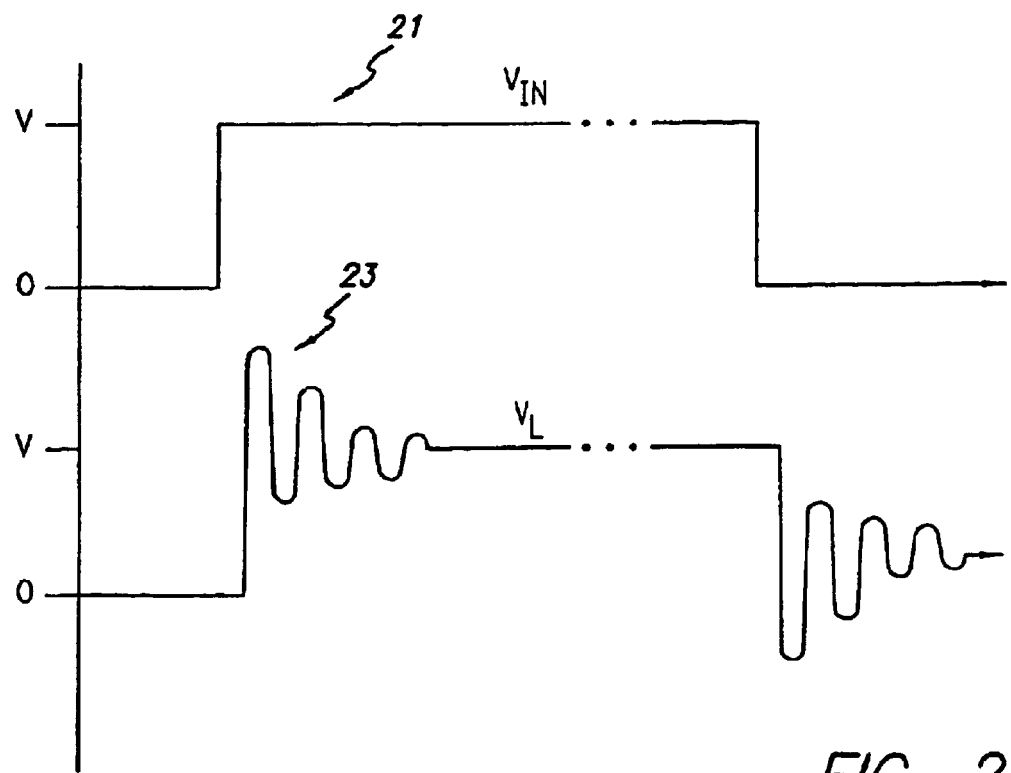
FIG. 2 illustrates the ringing that typically occurs in the prior art line driver system shown in FIG. 1.

FIG. 2 illustrates the ringing that typically occurs in the prior art line driver system shown in FIG. 1. The top of FIG. 2 illustrates a typical profile 21 for $V_{IN}$. As shown in this profile, $V_{IN}$ typically transition from a first voltage level (0 in this example) to a second voltage level (V in this example) and then later transitions back to the first voltage level.

A profile 23 is shown of the voltage $V_L$ that is delivered across the load. As shown by FIG. 2, however, $V_L$ does not always match $V_{IN}$. Not only is it slightly delayed in time (due to the time it takes the signal to travel through the transmission line 1), but there is noticeable "ringing" following each transition.

Of course, it is to be understood that the magnitude of the ringing, as well as the number of cycles in the ringing, will vary widely, depending upon the parameters of the system.

As indicated above, this ringing can be quite problematic. It exposes circuitry connected to both the input 13 and the output 15 of the transmission line to higher-than-normal voltage excursions, requiring the voltage ratings on these components to be increased beyond what would otherwise be needed. The ringing itself can also be misinterpreted by the circuitry as constituting a change in the data signal, creating the possibility of a data error.

Figure 3:
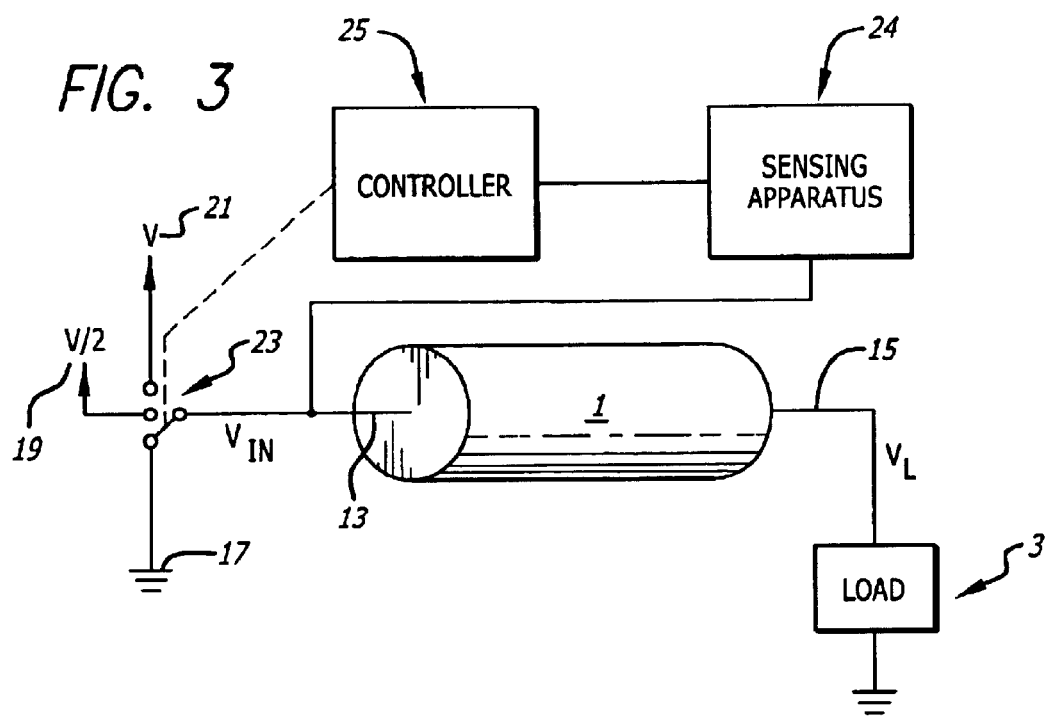
FIG. 3 illustrates a line driver system made in accordance with one embodiment of the invention.

FIG. 3 illustrates a line driver system made in accordance with one embodiment of the invention.

As in FIG. 1, FIG. 3 includes a transmission line 1 having an input 13 and an output 15 connected a load 3. Unlike FIG. 1, however, the system shown in FIG. 3 utilizes three drive signals, a first drive signal 17 (shown as ground), a second drive signal 19 (shown as V/2) and a third drive signal 21 (shown as V). The input 13 to the transmission line 1 is connected to a switching system 23 that causes the input 13 to the transmission line 1 to switch between one of the drive signals. The switching system 23, in turn, operates under the control of a controller 25.

Figure 4:
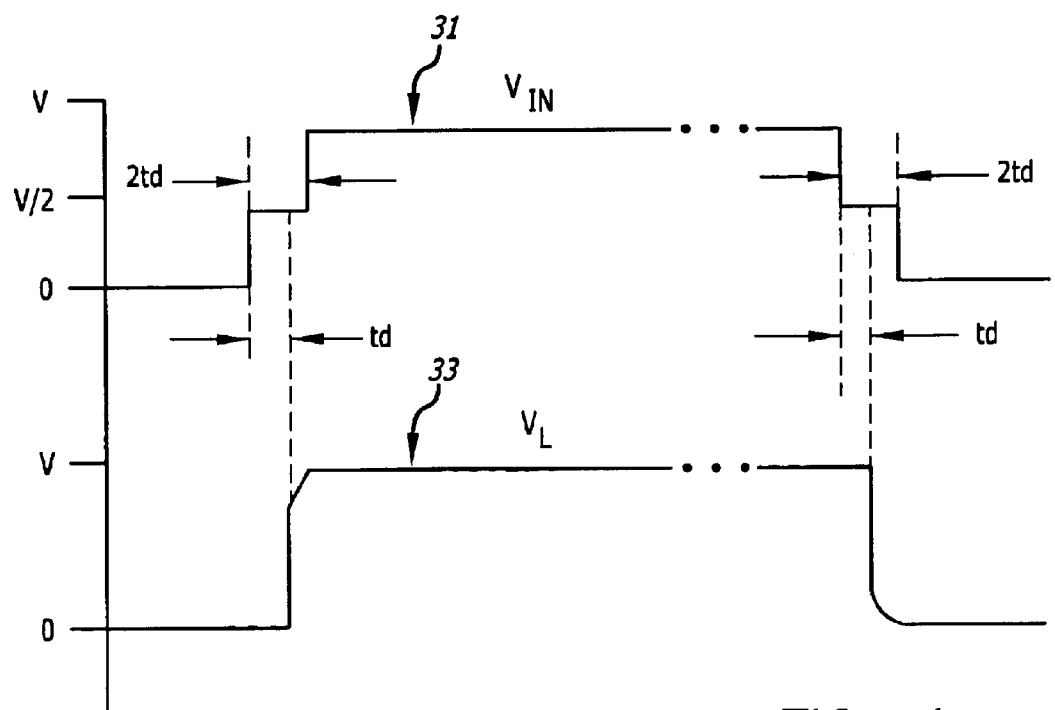
FIG. 4 illustrates the reduction in the ringing that typically occurs with the embodiment of the invention shown in FIG. 3.

FIG. 4 illustrates the reduction in the ringing that occurs with the embodiment of the invention shown in FIG. 3. As shown in FIG. 4, the controller 25 causes the switching system 23 to switch the input 13 of the transmission line 1 from the first drive signal 17 (shown as ground), to the second drive signal 19 (shown as V/2) and then to the third drive signal 21 (shown as V). Thereafter, the controller 25 causes the input 13 to the transmission line 1 to be connected back again to the second drive signal 19 (shown as V/2) and then the first drive signal 17 (shown as ground). This is illustrated in a profile 31.

The corresponding output voltage $V_L$ is illustrated in a profile 33 in FIG. 4.

As shown in FIG. 4, the load $V_L$ begins to transition from the first voltage level (ground) to the second voltage level (V/2) at time $t_d$ after the input voltage $V_{IN}$ makes this transition. The time $t_d$ represents the time it takes a signal to travel from the input 13 of the transmission line 1 to the output 15 of the transmission line 1.

As soon as the transition is received at the output 15 of the transmission line 1, it is reflected back to the input 13 because of the impedance mismatch. However, the signal from the input 13 is still traveling to the output 15. The reflected signal is therefore added to the incoming signal, causing $V_L$ at the output 15 of the transmission line 1 to rise all the way up to the level of the third input signal (V), as also shown in FIG. 4.

The controller 25 is configured to cause the switching system 23 to switch the input 13 to the third drive signal 21 (V) at approximately the moment the reflected signal first arrives back at the input 13 to the transmission line 1. The reflected signal is thus met with a new incoming signal, which is approximately equal in magnitude, thus substantially reducing any further reflections, even though there might be an impedance mismatch between the impedance of the transmission line and the impedance of the drive system. Mathematically, the step from the second drive signal level to the third drive signal level is timed to be approximately twice the signal delay time of the transmission line 1, $2t_d$, as also illustrated in FIG. 4.

The net result is that the ringing is reduced, as also illustrated in FIG. 4. Accordingly, the output voltage $V_L$ across the load 3 transitions smoothly from the level of the first drive signal (ground) to the level of the third drive signal (V) without noticeable ringing.

The reverse process is preferably followed during the downward transition of $V_{IN}$ from the level of the third drive signal (V) to the level of the first drive signal (ground), as also shown in FIG. 4. As shown in FIG. 4, this downward transition is also made in two steps. The first step is a transition from the level of the third drive signal (V) to the level of the second drive signal (V/2). Following a delay of approximately $2t_d$ (the time needed for the transition to the level of the second drive signal to be reflected from the end 15 of the transmission line 1 back to the beginning 13 of the transmission line 1), the second transition to the level of the first drive signal (ground) is made at the output 15. As shown in FIG. 4, this similarly causes the output voltage $V_L$ across the load 3 to transition smoothly from the level of the third drive signal (V) to the level of the first drive signal (ground) without appreciable ringing.

The voltages of the various drive signals can vary widely. Although the level of the first drive signal 17 is shown as being ground, it is to be understood that the level of the first drive signal 17 could, in fact, be a negative or a positive voltage with respect to ground. The level of the second drive signal 19 is between the level of the first drive signal 17 and the level of the third drive signal 21, as in the example discussed above.

In one embodiment, the level of the second drive signal 19 is midway between the level of the first drive signal 17 and the level of the third drive signal 21.

In another embodiment, the magnitude of the reflected signal that arrives back at the input 13 may be something less than twice the magnitude of the signal that is sent to the output 15. This can happen, for example, when the impedance of the load 3 is somewhat matched to the impedance of the transmission line 1. In this case, the level of the second drive signal is somewhat above the midway level on the rising transition, so that the level of the third drive signal matches the reflected level of the second drive signal; and the level of the second drive signal is somewhat below the midway level on the falling transition, so that the level of the first drive signal matches the reflected level of the second drive signal.

In a still further embodiment, the level of the second drive signal 19 is midway between the level of the first drive signal 17 and the level of the third drive signal 21, even when the impedance of the load 3 is somewhat matched to the impedance of the transmission line 1. Although this will not reduce the ringing as much, it is often easier to generate such a midway level signal.

The timing of each rising transition from the level of the first drive signal 17 to the level of the second drive signal 19 and the timing of the falling transition from the level of the third drive signal 21 to the level of the second drive signal 19 are usually governed by the timing of the data stream that is to be sent to the load 3 over the transmission line 1.

On the other hand, the timing of the rising transition from the level of the second drive signal 19 to the level of the third drive signal 21 and the timing of the falling transition from the level of the second drive signal 12 to the level of the first drive signal 17 are governed by the length of the transmission line 1 and, more particularly, by the time it takes a signal to travel round-trip through the transmission line 1. This amount is noted on FIG. 4 as $2t_d$.

The controller 25 is configured to cause the switching system 23 to sequentially switch from the level of the first drive signal 17 to the level of the second drive signal 19 and then to level of the third drive signal 21, and to then sequentially switch from the level of the third drive signal 21 to the level of the second drive signal 19 and then to the level of the first drive signal 17 in accordance with these timing requirements. As indicated above, the timing of the switch between the level of the first drive signal 17 and the level of the second drive signal 19 on the rising edge and the switch between the level of the third drive signal 21 and the level of the second drive signal 19 on the falling edge are externally governed by the timing of the data stream that is to be delivered. On the other hand, the timing of the rising transition from the level of the second drive signal 19 to the level of the third drive signal 21 and the falling transition from the level of the second drive signal 19 to the level of the first drive signal 17 are governed by internal considerations, namely the time it takes the earlier drive signal to make a round trip through the transmission line 1.

In one embodiment, this internal timing is established by empirical calculation or by experimental testing of an actual transmission line. Once determined, the controller 25 is programmed with this delay information, thus operating in an "open loop" mode.

In another embodiment, a sensing apparatus 24 is connected to the input 13 of the transmission line 1 to detect when a reflection of a transition arrives back at the input 13 to the transmission line 1. Upon detection, the sensing apparatus 24 communicates with the controller 25 to initiate the next transition that is needed. In this "closed loop" configuration, the second step is initiated based on the detection of the return of an actual reflection, not based on a prior calculation or measurement.

Figure 5A:
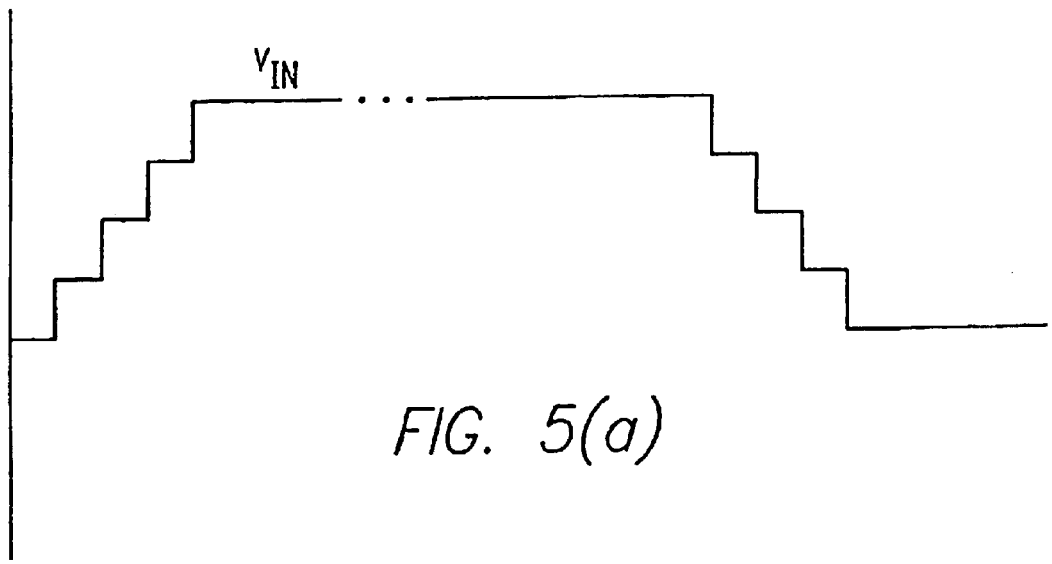
FIGS. 5(*a*) and (*b*) illustrate two other input wave shapes that are useful in other embodiments of the invention.

Although having thus-far described the input signal $V_{IN}$ as being composed of three drive signals each at different levels, it is to be understood that the input signal $V_{IN}$ could be composed of a greater number of drive signals, such as 5 or 7, as shown in FIGS. 5(a) and (b), respectively. In this instance, of course, an equivalent number of supplies would be needed, one for each input level. Similarly, the switching system, such as the switching system 23 shown in FIG. 3, would need to be configured to sequentially switch between each drive signal. Correspondingly, the controller, such as the controller 25 shown in FIG. 3, would need to be configured to cause the switching system to sequentially switch between the different drive signals. The timing of the first rising step and the first falling step would, again, be externally governed by the timing of the data signal that is to be delivered to the load 3. Each of the subsequent even steps (e.g., the second or fourth step) would be timed to begin the moment the reflection of the transition from the immediately preceding step arrives back at the beginning 13 of the transmission line 1. The timing of the remaining odd-numbered steps (e.g., steps 3 or 5) could vary. Preferably, though, the timing of the remaining odd-numbered steps would be short to maximize the speed of data transfer. Indeed, each remaining odd-numbered step could be made at the same time as its preceding even numbered step. In this embodiment, each pair of even and odd numbered steps would be merged into a single step, thus reducing the total number of steps and supplies.

One continuing problem when driving transmission lines with data signals is energy losses that occur during signal transitions. These losses become particularly great when the transmission line 1 has a large resistance. These energy losses can be particularly problematic in low-power applications, such as in a VLSI pin driver used for fast chip-to-chip communication.

Figure 6:
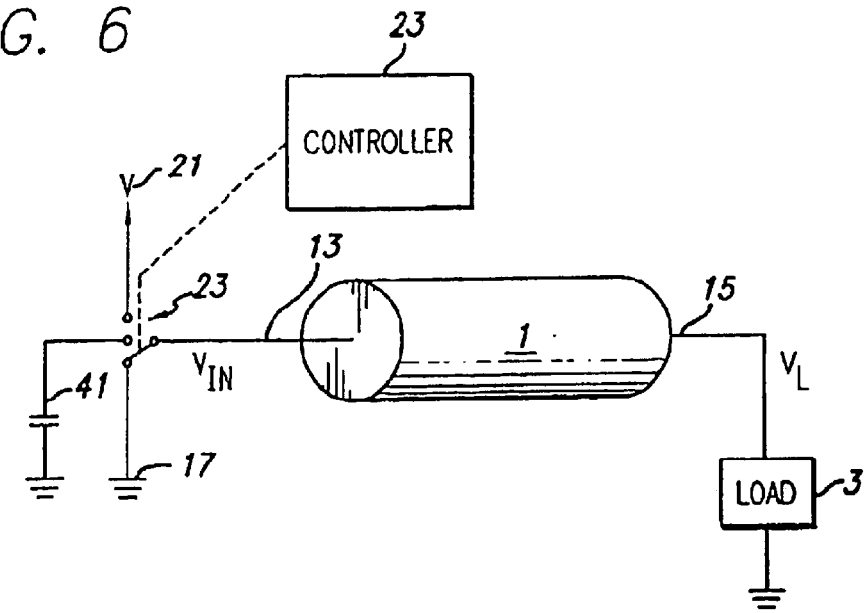
FIG. 6 illustrates a line driver system made in accordance with another embodiment of the invention that additionally provides energy recovery.

FIG. 6 illustrates a line driver system made in accordance with another embodiment of the invention that, in addition to ring reduction, minimizes these energy losses. The system is the same as the system shown in FIG. 3, except that the second drive signal 19 is generated by a capacitor 41, instead of a source, such as the V/2 shown in FIG. 3. This modification adds an energy-recovery function to the invention.

When first energized, the switch from the first drive signal 17 (ground in this example) to the second drive signal 41 will have no effect. $V_{IN}$ will remain at the level of the first drive signal 17 (ground). The succeeding switch to the third drive signal 21 (V in this example) will then cause $V_{IN}$ to jump to the third drive signal (V), much as in the prior art system shown in FIG. 1. Unless the impedance of the load is matched to the impedance of the transmission line 1, the output voltage $V_L$ will suffer from ringing following this first transition, again much like in the system shown in FIG. 1.

During the first falling transition, the switching system 23 switches from the third drive signal 21 (V) to the second drive signal 41. Although the level of the second drive signal 41 starts out at the level of the first drive signal (ground in this example), the current that flows into the capacitor 41 from the load 3 charges it to a level between the first drive signal 17 (ground) and the third drive signal 21 (V).

During the second rising transition, the switch from the first drive signal 17 to the second drive signal 41 causes a small transition in $V_{IN}$. The amount of ringing caused by the second rising transition is thus reduce somewhat.

During the second falling transition, the capacitor 41 will start out at a level between the third drive signal 21 and the first drive signal 17. This will reduce the ringing that is caused by the second falling transition somewhat. During the third rising transition, the initial voltage across the capacitor 41 will be even higher, thus further reducing the ringing that is caused by the third rising transition.

After several rising and falling transitions, the voltage level on the capacitor 41 stabilizes to approximately V/2, the level that in most embodiments maximizes the reduction of ringing during both rising and falling transitions. Thereafter, the system in FIG. 6 functions to reduce ringing, just like the system in FIG. 3.

Unlike the system in FIG. 3, however, the system in FIG. 6 is accomplishing another important function—energy conservation. In both FIG. 3 and FIG. 6, energy is delivered into the transmission line 1 and the capacitive load 3 during each rising transition and is then removed from the capacitive load 3 and the transmission line 1 during each falling transition. In FIG. 3, however, most of the removed energy is dissipated as heat in the intrinsic resistances of the switching system 23 and the internal impedances of the drive signal supplies. In FIG. 3, on the other hand, a significant portion of that returning energy is stored in the capacitor 41. Instead of being dissipated or otherwise wasted, this stored energy is then reused during the next rising transition. The system in FIG. 6 thus conserves energy that would otherwise have been wasted, while simultaneously reducing ringing, all without adding any components to the system that dissipate additional energy.

Although having described this energy-recovery embodiment of the invention as utilizing a capacitor, i.e., capacitor 41, other forms of energy-storage devices could be used instead, such as an inductor, a combination of an inductor or capacitor, or others combinations of components.

Figure 7:
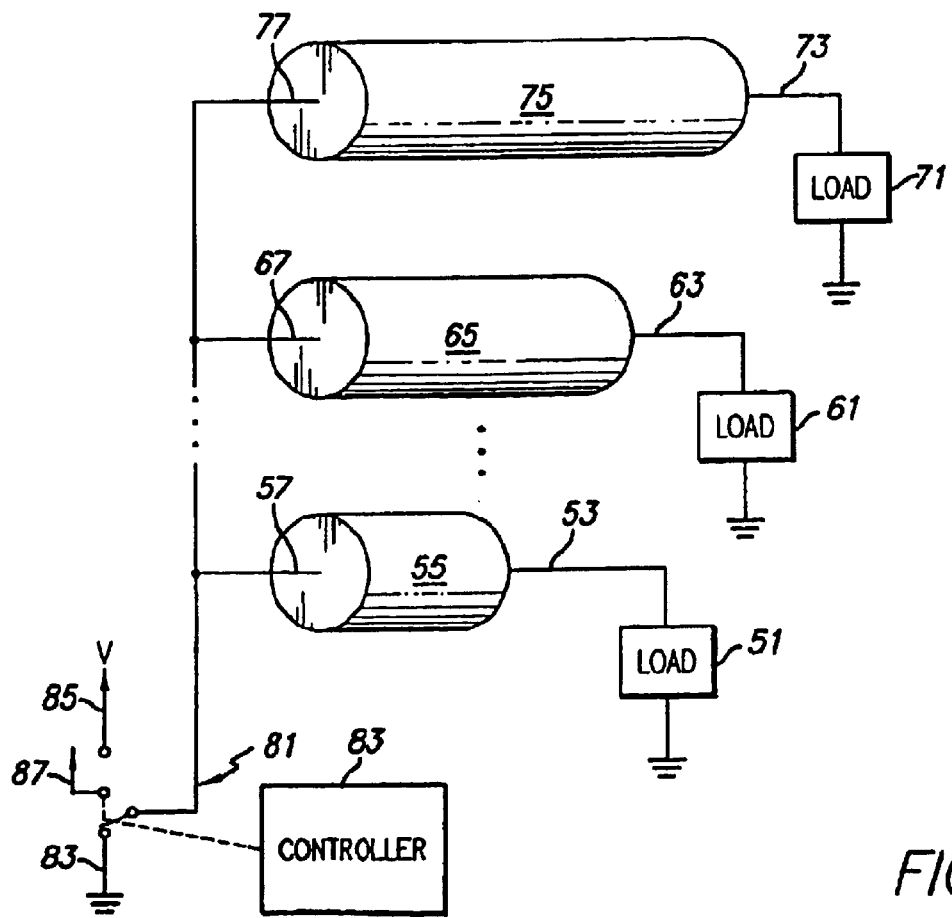
FIG. 7 illustrates a line driver system made in accordance with another embodiment of the invention that drives a plurality of transmission lines of varying length.

FIG. 7 illustrates a line driver system made in accordance with another embodiment of the invention that drives a plurality of transmission lines of varying length. As shown in FIG. 7, a load 51 is driven at an output 53 of a transmission line 55 having an input 57; a load 61 is driven at an output 63 of a transmission line 65 having an input 67; and a load 71 is driven at an output 73 of a transmission line 75 having an input 77.

As also shown in FIG. 7, the lengths of the transmission lines 55, 65 and 75 are different, and their inputs 57, 67 and 77 are all connected to the output of a switching system 81. The inputs to the switching system 81, such as inputs 83, 85 and 87, are each connected to a drive signal. Although not shown, it is to be understood that the switching system 81 may have additional inputs connected to other drive signals. A controller 83 controls switching of the switching system 81 to cause it to sequentially switch between the various drive signals. As with the systems described in FIGS. 3 and 6, the first rising step and the first falling step are externally governed by the timing of the data signal to be delivered. The remaining even steps are timed to coincide with the arrival of reflections, such that each reflection is met by an equivalent input signal, thus reducing any further reflection that might otherwise be caused. As each new step introduced by the driver will travel down all the transmission lines (with the exception of the line whose incoming transition the new step served to cancel), the number of reflected transmissions requiring new steps for canceling will grow quickly unless the lengths of the transmission lines are related to small integers. As each reflected transition will in practice have been damped somewhat compared to the outgoing transition, there will be a point of diminishing returns where the power lost through ringing will be smaller than the power spent in the line driver on generating additional steps.

Figure 5B:
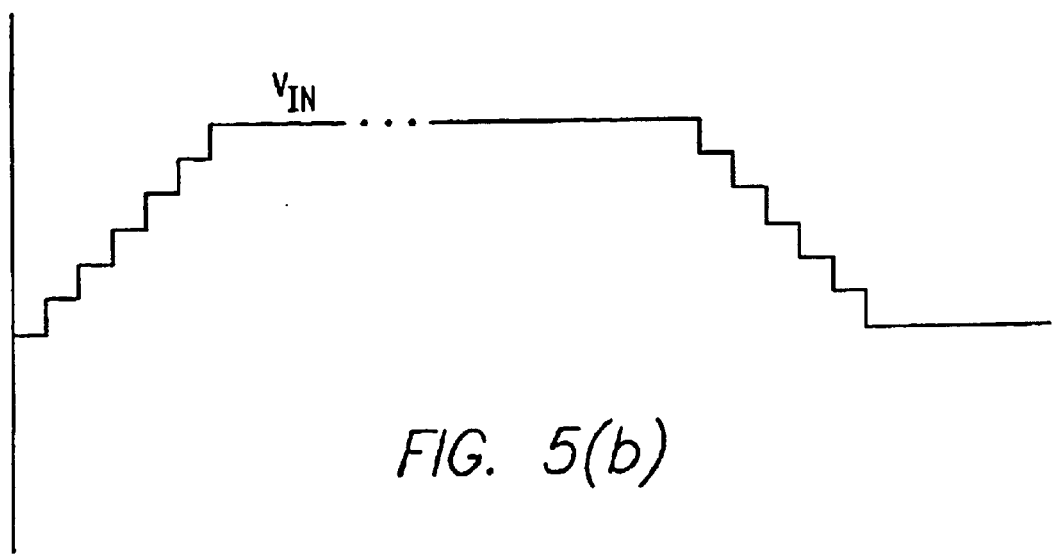
Figure 8:
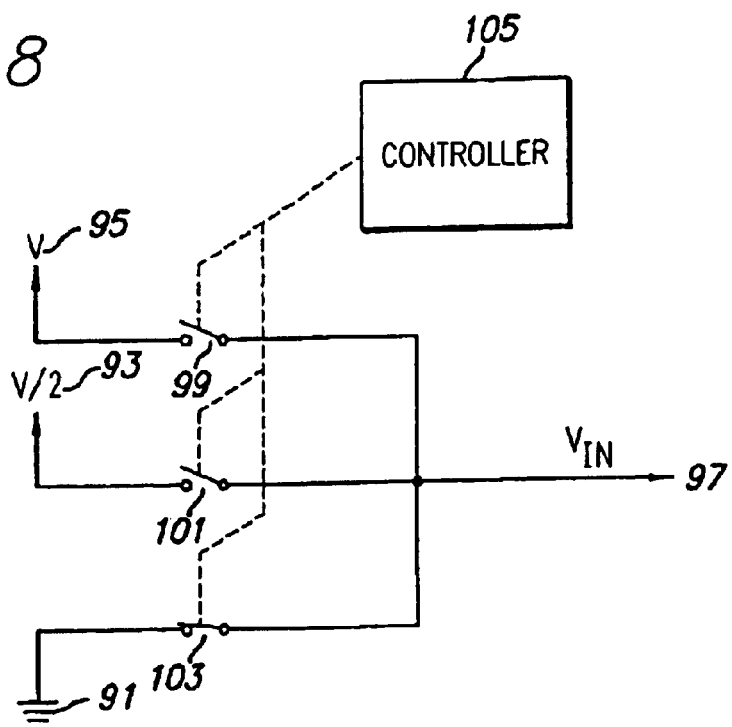
FIG. 8 illustrates another embodiment of the signal generation system of the invention.

FIG. 8 illustrates another embodiment of the signal generation system of the invention. Thus far, the switching systems, such as the switching system 23 shown in FIGS. 2 and 6 and the switching system 81 shown in FIG. 7, have been illustrated as a single pole, multiple throw switch. Although such a choice simplifies the discussion that has thus far been presented, single pole, multiple throw electronic switches are not common. A more practical approach for implementing these switching system is the approach shown in FIG. 8. As shown in FIG. 8, each drive signal 91, 93 and 95 is connected to the input 97 of a transmission line (not shown) through its own electronic switch, such as electronic switches 99, 101 and 103, respectively. Instead of simply controlling a single switch, a controller 105 is configured to independently control each of the electronic switches 99, 101 and 103, such that when one electronic switch opens, the next in sequence closes. Thus, the use of a plurality of single pole, single throw switches as the switching system can readily be adapted to any number of drive signals, such as the five levels shown in FIG. 5(a) or the seven levels shown in FIG. 5(b).

Again, each of these switches are preferably electronic, such as a MOSFET, SCR, triac or BJT. Other configurations known in the art for the switching system, of course, are also contemplated.

Figure 9:
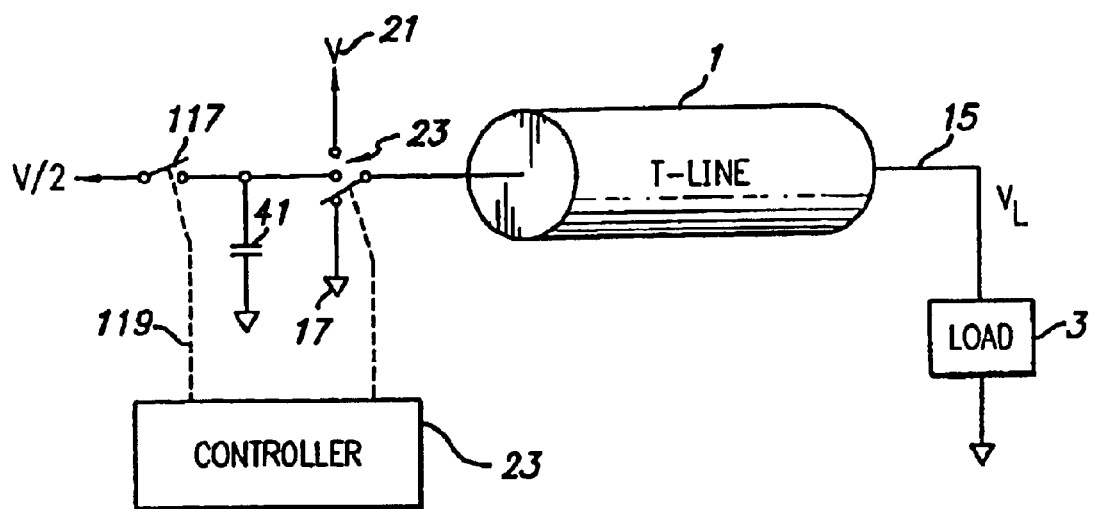
FIG. 9 is an alternate embodiment of the line driver system shown in FIG. 6 containing a replenishing system.

FIG. 9 is an alternate embodiment of the line driver system shown in FIG. 6 with a replenishment subsystem. All of the components in FIG. 9 are the same as those in FIG. 6 with the exception of a switch 117 and an additional connection 119 between the switch 117 and the controller 23.

In operation, the voltage across the capacitor 41 may slowly decline from the V/2 value because of losses in the transmission line 1. By periodically activating the switch 117 from a control signal from the controller 23 over the control line 119, the V/2 value across the capacitor 41 can be replenished. Preferably, this refreshing would be done at a moment in time when the capacitor 41 is not connected to the line 1 through the switch 23. Of course, it could also be refreshed when it is connected.

Although having thus far described certain embodiments of the invention, it is to be understood that the invention embraces many other embodiments and configurations and has many other benefits. The invention is limited solely by the claims that now follow.

What is claimed is:

1. A driver for driving a transmission line connected to a load, the transmission line having an input and an output, comprising:

a. a signal generation system that generates at least a first drive signal, a second drive signal and a third drive signal, the second drive signal having a level greater than the first drive signal, and the third drive signal having a level greater than the second drive signal; and b. a controller in communication with said signal generation system to cause said signal generation system to deliver the first drive signal, then the second drive signal, and then the third drive signal to the input of the transmission line, the third drive signal beginning to be delivered to the input of the transmission line approximately when a reflection of the second drive signal from the output of the transmission line first arrives at the input to the transmission line;

wherein the driver is arranged to drive a plurality of transmission lines of varying length.

2. The driver of claim 1 wherein said signal generation system includes a source of the second drive signal and wherein said source includes an energy-storage device.

3. The driver of claim 2 said energy-storage device receives all of its charge solely from the transmission line.

4. The driver of claim 2 wherein said energy-storage device includes a capacitor.

5. The driver of claim 1 wherein the level of the second drive signal is approximately midway between the level of the first drive signal and the third drive signal.

6. The driver of claim 1 wherein the level of the third drive signal is approximately equal to the reflected level of the second drive signal when it first arrives at the input of the transmission line.

7. The driver of claim 1 wherein said signal generation system also generates a plurality of drive signals, in addition to the first drive signal, the second drive signal and the third drive signal.

8. The driver of claim 7 wherein said signal generation system includes a source for each of the plurality of additional drive signals and wherein said source includes an energy-storage device.

9. The driver of claim 8 wherein said energy-storage device receives all of its charge solely from the transmission line.

10. The driver of claim 8 wherein said energy-storage device includes a capacitor.

11. The driver of claim 1 wherein:

a. said signal generation system includes a supply for generating each of the drive signals and a switching system that selectively connects each of the drive signals to the input of the transmission line; and wherein b. said controller controls said switching system.

12. The driver of claim 1 wherein said controller also causes said signal generation system to deliver the third drive signal, then the second drive signal and then the first drive signal to the input of the transmission line, the first drive signal beginning to be delivered to the input of the transmission line at approximately when a reflection of the second drive signal from the output of the transmission line first arrives at the input to the transmission line.

13. A process for driving a transmission line connected to a load, the transmission line having an input and an output, comprising;

a. generating at least a first drive signal, a second drive signal and a third drive signal, the second drive signal having a level greater than the first drive signal and the third drive signal having a level greater than the second drive signal; and b. delivering the first drive signal, then the second drive signal and then the third drive signal to the input of the transmission line, the third drive signal beginning to be delivered to the input of the transmission line approximately when a reflection of the second drive signal from the output of the transmission line first arrives at the input to the transmission line whereby a reflection of a transition is sensed upon arrival at the input to the transmission line, wherein the process is adapted to drive a plurality of transmission lines of varying length.

14. The process of claim 13 wherein a source is used to provide the second drive signal and wherein the an energy-storage device.

15. The process of claim 14 wherein the energy-storage device receives all of its charge solely from the transmission line.

16. The process of claim 14 wherein the energy-storage device includes a capacitor.

17. The process of claim 13 wherein the level of the second drive signal is approximately midway between the level of the first drive signal and the third drive signal.

18. The process of claim 13 wherein the level of the third drive signal is approximately equal to the reflected level of the second drive signal when it first arrives at the input of the transmission line.

19. The process of claim 13 also comprising generating a plurality of drive signals in addition to the first drive signal, the second drive signal and the third drive signal.

20. The process of claim 19 wherein a source is used to generate each of the plurality of additional drive signals and wherein the source includes an energy-storage device.

21. The process of claim 20 wherein the energy-storage device receives all of its charge solely from the line.

22. The process of claim 20 wherein the energy-storage device includes capacitor.

23. The process of claim 13 wherein:

a. a supply generates each of the drive signals and a switching system selectively connects each of the drive signals to the input of the transmission line; and wherein b. a controller controls the switching system.

24. The process of claim 13 also comprising delivering the third drive signal, then the second drive signal and then the first drive signal to the input of the transmission line, the first drive signal beginning to be delivered to the input of the transmission line at approximately when a reflection of the second drive signal from the output of the transmission line first arrives at the input to the transmission line.

* * * * *